(12) United States Patent
Liebenow

(10) Patent No.: US 6,459,896 B1
(45) Date of Patent: Oct. 1, 2002

(54) NOTIFICATION OF LOW-BATTERY IN A WIRELESS NETWORK

(75) Inventor: Frank Liebenow, Dakota Dunes, SD (US)

(73) Assignee: Gateway, Inc., Poway, CA (US)

( * ) Notice: Subject to any disclaimer, the term of this patent is extended or adjusted under 35 U.S.C. 154(b) by 0 days.

(21) Appl. No.: 09/419,990

(22) Filed: Oct. 18, 1999

(51) Int. Cl.[7] .............................. H04B 7/20; H04B 1/38
(52) U.S. Cl. ...................... 455/425; 455/423; 455/572; 455/575
(58) Field of Search ................ 455/127, 67.1, 455/67.7, 425, 550, 423, 572–575

(56) References Cited

U.S. PATENT DOCUMENTS

| | | | | |
|---|---|---|---|---|
| 4,509,201 A | | 4/1985 | Sekigawa et al. ............... 455/73 |
| 4,590,331 A | * | 5/1986 | Nunemaker et al. ......... 179/5 R |
| 4,622,544 A | * | 11/1986 | Bially et al. ................. 340/636 |
| 4,658,509 A | | 4/1987 | Juengel ......................... 33/558 |
| 5,036,532 A | | 7/1991 | Metroka et al. ............... 379/58 |
| 5,287,404 A | * | 2/1994 | Pepper et al. ................ 379/377 |
| 5,365,570 A | | 11/1994 | Boubelik ...................... 379/59 |
| 5,371,783 A | * | 12/1994 | Rose et al. .................... 379/61 |
| 5,448,748 A | | 9/1995 | Yawata et al. ............... 364/500 |
| 5,497,507 A | * | 3/1996 | Komaki ........................ 455/89 |
| 5,555,287 A | | 9/1996 | Gulick et al. ................. 379/61 |
| 5,623,533 A | | 4/1997 | Kikuchi et al. ................ 379/58 |
| 5,673,304 A | | 9/1997 | Connor et al. ................ 379/45 |
| 5,689,549 A | * | 11/1997 | Bertocci et al. ............... 379/61 |
| 5,726,636 A | | 3/1998 | Hayes, Jr. .................... 340/636 |
| 5,814,995 A | * | 9/1998 | Tasdighi ...................... 324/431 |
| 6,144,840 A | * | 11/2000 | Alton et al. ................. 455/38.3 |

FOREIGN PATENT DOCUMENTS

| | | | | |
|---|---|---|---|---|
| JP | 03-182129 | * | 8/1991 | ......... H04B/007/26 |
| JP | 04140951 A | * | 5/1992 | ............ H04B/7/26 |
| JP | 08169226 | | 6/1996 | ............ H04B/7/26 |
| WO | WO 99/15967 A1 | | 4/1999 | ......... G06F/11/273 |
| WO | WO 01/10152 A1 | | 2/2001 | ............ H04Q/7/32 |

* cited by examiner

Primary Examiner—Daniel Hunter
Assistant Examiner—Meless Zewdu
(74) Attorney, Agent, or Firm—William J. Breen, III; Scott Charles Richardson; Suiter & Associates

(57) ABSTRACT

A system and method for notifying a remote device of a low battery capacity condition in a wireless communications system is disclosed. A detector monitors the capacity of the battery in a wireless device receiving operational power from the battery for a low capacity condition. A control system coupled to the detector sends a low battery capacity status signal to the remote device upon detection a low battery capacity condition. While the battery is in a low capacity condition, communications between the wireless device and the remote device may be maintained until the low battery capacity condition is corrected.

8 Claims, 3 Drawing Sheets

NOTIFICATION OF LOW-BATTERY IN A WIRELESS NETWORK

FIELD OF THE INVENTION

The present invention generally relates to the field of information handling systems, and particularly to battery powered wireless communications systems.

BACKGROUND OF THE INVENTION

Advents in electronics and battery technologies have resulted in a proliferation of wireless communications devices. Wireless communications devices are typically powered from a battery contained within the device. Eventually, all batteries run low due to continued use of the wireless device. Since batteries exhibit behavior which varies from charge cycle to charge cycle and over the life of the battery, and because wireless devices typically have varying current requirements depending upon the conditions under which they are utilized, it is often difficult to detect exactly when battery capacity will fall to level at which operation of the wireless device fails. Often, a battery will fail in the middle of an operation or task that the wireless device is performing thereby causing termination of wireless communications between the wireless device and a remote device or user. In this situation, the remote device or user receives no warning that communications are about to be disrupted or the reason why communications have been disrupted. Often, the remote device or user attempts to re-establish the connection to the wireless device to no avail since the battery in the wireless device is dead.

Prior systems that monitor battery power typically provide either an audio or visual warning signal only to the user of the wireless device upon detection of a low battery state. If the warning signal is a visual signal, e.g., a blinking light or LED, it is difficult to see the warning light when the wireless device is placed out of sight, for example when a telephone is placed to the ear during use. Furthermore, a user may ignore an audio warning signal when the focused upon another task such as an engaging conversation. In any event, only the user of the wireless device is warned of the low battery status condition, but the remote device or user is not warned. Additionally, prior systems provide no way for maintaining the connection while the user of the wireless device solved the low battery status situation, e.g., replaced the depleted battery with a fresh battery or utilized an alternative device. Thus, there lies a need for a system and method of notifying a remote user or device of a low battery status condition in a wireless device and for maintaining communications between the base station of a user's wireless device and the remote user or device while the low battery status condition situation is addressed and corrected.

SUMMARY OF THE INVENTION

The present invention is directed to a system for notifying a remote device of a low battery capacity condition in a wireless communications system. In one embodiment of the invention, the system includes a wireless device receiving operational power from a battery, the wireless device communicating with the remote device, a detector coupled to the battery for detecting a low battery capacity condition of the battery, the detector generating a low battery capacity status signal upon detecting a low battery capacity condition of the battery, and a control system coupled to the detector for receiving the low battery capacity status signal from the detector, the control system sending the low battery capacity status signal generated by the detector to the remote device, the control system maintaining communications between the wireless device and the remote device during the low battery capacity condition.

The present invention is further directed to a method for notifying a remote device of a low battery capacity condition in a wireless device communicating with the remote device. In one embodiment of the invention, the method includes the steps of monitoring the capacity of the battery whereby a low capacity condition may be detected, upon detecting a low capacity condition of the battery, sending a low battery capacity status signal to the remote device, and while the battery is in a low battery capacity condition, maintaining communications between a base station for the wireless device and a remote device until the low battery capacity condition is corrected.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanyingc figures in which.

DETAILED DESCRIPTION OF THE INVENTION

Reference will now be made in detail to the presently preferred embodiment of the invention, an example of which is illustrated in the accompanying drawings.

Figure 1:
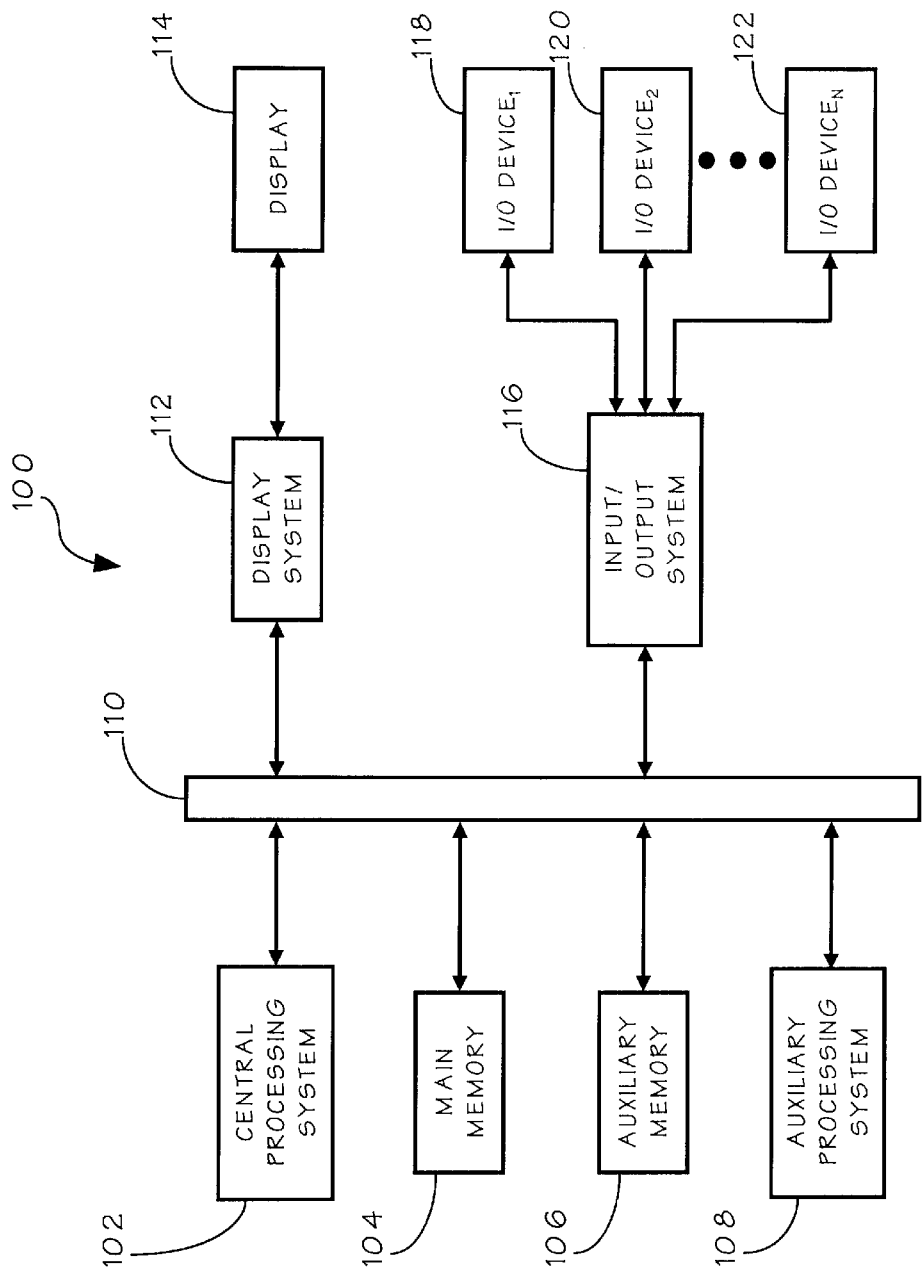
FIG. 1 is a block diagram of a computer-based information handling system operable to embody the present invention.

Referring now to FIG. 1, a hardware system in accordance with the present invention will be discussed. The hardware system shown in FIG. 1 is generally representative of the hardware architecture of a computer-based information handling system of the present invention. A central processing system 102 controls the hardware system 100. Central processing system 102 includes a central processing unit such as a microprocessor or microcontroller for executing programs, performing data manipulations and controlling the tasks of hardware system 100. Communication with central processor 102 is implemented through a system bus 110 for transferring information among the components of hardware system 100. Bus 110 may include a data channel for facilitating information transfer between storage and other peripheral components of hardware system 100. Bus 110 further provides the set of signals required for communication with central processing system 102 including a data bus, address bus, and control bus. Bus 110 may comprise any state of the art bus architecture according to promulgated standards, for example industry standard architecture (ISA), extended industry standard architecture (EISA), Micro Channel Architecture (MCA), peripheral component interconnect (PCI) local bus, standards promulgated by the Institute of Electrical and Electronics Engineers (IEEE) including IEEE 488 general-purpose interface bus (GPIB), IEEE 696/S-100, and so on. Other components of hardware system 100 include main memory 104, auxiliary memory 106, and an auxiliary processing system 108 as required. Main memory 104 provides storage of instructions and data for programs executing on central processing system 102. Main memory 104 is typically semiconductor based memory such as dynamic random access memory (DRAM) and or static random access memory (SRAM). Auxiliary memory 106 provides storage of instructions and data that are loaded into the main memory 104 before execution. Auxiliary memory 106 may include semiconductor based memory such as read-only memory (ROM), programmable read-only memory (PROM) erasable programmable read-only memory (EPROM), electrically erasable read-only memory (EEPROM), or flash memory (block oriented memory similar to EEPROM). Auxiliary memory 106 may also include a variety of non-semiconductor based memories, including but not limited to magnetic tape, drum, floppy disk, hard disk, optical, laser disk, compact disc read-only memory (CD-ROM), digital versatile disk read-only memory (DVD-ROM), digital versatile disk random-access memory (DVD-RAM), etc. Other varieties of memory devices are contemplated as well. Hardware system 100 may optionally include an auxiliary processing system 108 which may be a digital signal processor (a special-purpose microprocessor having an architecture suitable for fast execution of signal processing algorithms), a back-end processor (a slave processor subordinate to the main processing system), an additional microprocessor or controller for dual or multiple processor systems, or a coprocessor.

Hardware system 100 further includes a display system 112 for connecting to a display device 114, and an input/output (I/O) system 116 for connecting to one or more I/O devices 118, 120 up to N number of I/O devices 122. Display system 112 may comprise a video display adapter having all of the components for driving the display device, including video random access memory (VRAM), buffer, and graphics engine as desired. Display device 114 may comprise a cathode ray-tube (CRT) type display such as a monitor or television, or may comprise alternative type of display technologies such as a liquid-crystal display (LCD), a light-emitting diode (LED) display, or a gas or plasma display. Input/output system 116 may comprise one or more controllers or adapters for providing interface functions between one or more of I/O devices 118–122. For example, input/output system 116 may comprise a serial port, parallel port, infrared port, network adapter, printer adapter, radio-frequency (RF) communications adapter, universal asynchronous receiver-transmitter (UART) port, etc., for interfacing between corresponding I/O devices such as a mouse, joystick, trackball, trackpad, trackstick, infrared transducers, printer, modem, RF modem, bar code reader, charge-coupled device (CCD) reader, scanner, compact disc (CD), compact disc read-only memory (CD-ROM), digital versatile disc (DVD), video capture device, touch screen, stylus, electroacoustic transducer, microphone, speaker, etc. Input/output system 116 and I/O devices 118–122 may provide or receive analog or digital signals for communication between hardware system 100 of the present invention and external devices, networks, or information sources. Input/output system 116 and I/O devices 118–122 preferably implement industry promulgated architecture standards, including Ethernet IEEE 802 standards (e.g., IEEE 802.3 for broadband and baseband networks, IEEE 802.3z for Gigabit Ethernet, IEEE 802.4 for token passing bus networks, IEEE 802.5 for token ring networks, IEEE 802.6 for metropolitan area networks, 802.11 for wireless networks, and so on), Fibre Channel, digital subscriber line (DSL), asymmetric digital subscriber line (ASDL), frame relay, asynchronous transfer mode (ATM), integrated digital services network (ISDN), personal communications services (PCS), transmission control protocol/Internet protocol (TCP/IP), serial line Internet protocol/point to point protocol (SLIP/PPP), and so on. It should be appreciated that modification or reconfiguration of hardware system 100 of FIG. 1 by one having ordinary skill in the art would not depart from the scope or the spirit of the present invention.

Figure 2:
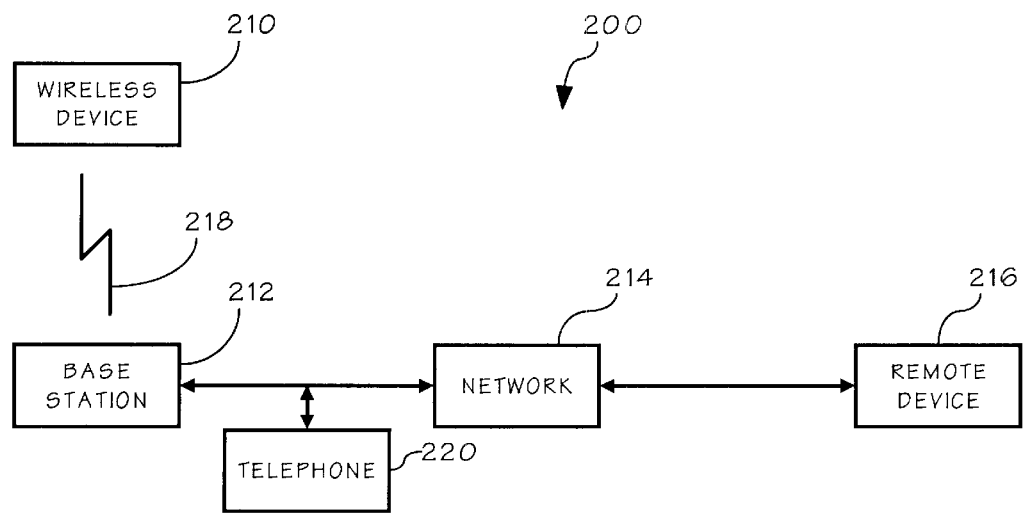
FIG. 2 is a block diagram of a communications system in accordance with the present invention.

Referring now to FIG. 2, a block diagram of a communications system in accordance with the present invention will be discussed. A wireless device 210 communicates with a base station 212 via a wireless transmission system 218. Base station 212 in turn communicates with a remote device 216 via a network 214. Wireless device 210 may be a cordless telephone, or a cellular or personal communications system (PCS) telephone, for example, and network 214 may be a plain old telephone system (POTS). Wireless transmission system and protocol 218 and network 214 may alternatively comprise any of the networks discussed with respect to FIG. 1. Furthermore, wireless device 210 may comprise an information handling system such as a network terminal, and base station 212 and remote device 216 may each comprise a computer-based information handling system such as information handling system 100 shown in FIG. 1, the base station 212 and remote device 216 being in communication via any of the network protocols discussed with respect to FIG. 1. Alternatively, wireless device 210 may comprise a standard cordless telephone such as utilized in a home or office environment that communicates with base station unit 212 connected to a telephone network, e.g., POTS, to communicate with a user of remote device 216 wherein remote device 216 also may be a telephone. Typically, wireless device 210 receives operational power from a battery stowed within a housing of wireless device 210, while base station 212 receives operational power from an external power source, e.g., ac power from an ac wall outlet. Where wireless device 210 is a standard cordless telephone, remote device 216 may be a standard telephone, or a cordless telephone, such that a user of wireless device 210 may communicate with a user of remote device 216.

Figure 3:
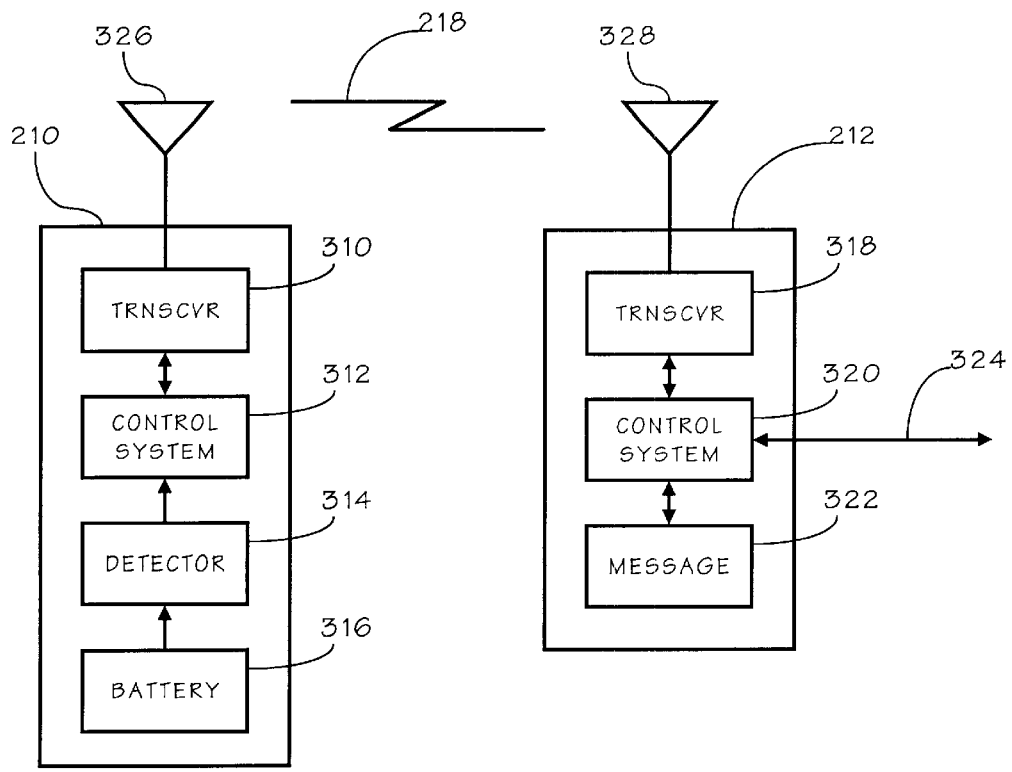
FIG. 3 is a block diagram of a wireless device and base station as shown in FIG. 2 in accordance with the present invention.

Referring now to FIG. 3, a block diagram of a wireless device and base station as shown in FIG. 2 is shown in accordance with the present invention. Wireless device 210 includes a battery 316 for providing operational power to wireless device 210. A detector 314 is coupled to the output of battery 316 in order to monitor battery capacity such that the capacity status of battery 316 may be detected and determined by means known in the art. Detector 314 provides the status of battery 316 to control system 312. Control system 312 controls the operation and functions of wireless device 210 and may include central processing system 102 of FIG. 1. Control system 312, upon receiving battery status information from detector 314, sends the battery status information to transceiver 310 for transmission to base station 212 via wireless transmission system 218 in accordance with a wireless transmission communication protocol. For example, in the instance where control system 312 is a digital control system that transmits information via wireless system 218 in accordance with a digital communications protocol, battery status information may be transmitted as a battery status bit wherein a first logical state represents a normal battery capacity state and a second logical state represents a low capacity state for battery 316. The communications protocol may be implemented, for example, as a program of instructions executed by control systems 312 and 320.

Wireless transmission system 218 may be, for example, a radio-frequency (RF) communications system wherein transceiver 310 and transceiver 318 transmit and receive information with antennas 326 and 328 at radio frequencies. Alternatively, wireless transmission system 218 may be an infrared (IR) communications system wherein transceiver 310 and transceiver 318 transmit information as modulated infrared radiation via light emitting diodes (IR LEDs) and receive such information via infrared detectors. Control system 320 of base station 212 may be similar to control system 312 of wireless device 210. Control system 320 couples to remote device 216 via network 214 with transmission line 324. In an alternative embodiment of the present invention, base station 212 may be considered to be the remote device communicating with wireless device 210 in lieu of remote device 216 at shown in FIG. 2. In such a case, when detector 314 detects a low battery capacity condition of battery 316, wireless device 210 notifies base station 212, the remote device, of the low battery capacity status of battery 316 by sending a low battery capacity status signal to base station 212. It will be understood by those skilled in the art that such a low battery capacity status signal may be of analog or digital form and may, depending upon embodiment, be conveyed by the presence of a low battery signal or, in alternative embodiments, by the absence of a normally transmitted good battery signal.

In the embodiment of the present invention where wireless device 210 communicates with remote device 216 through base station 212, upon detection of the low battery capacity condition of battery 316, a low battery capacity status signal is transmitted to base station 212. In some embodiments, when base station 212 receives the low battery capacity status signal from wireless device 210, control system 320 of base station 212 activates a message 322 and transmits the message to remote device 216 via transmission line 324 over network 214. Message 322 may be stored, for example, as an analog signal stored upon an analog information storage device such as a magnetic recording medium, e.g., magnetic tape, or as a digital signal stored in a digital information storage device such as a semiconductor memory. The digital information storage device may also be a memory device such as auxiliary memory 106 of computer-based information handling system 100 as shown in FIG. 1. Message 322 may be a machine readable message intended to be interpreted by remote device 216, may be a voice signal intended to be interpreted by a user of remote device 216, or may be an audible tone capable of being interpreted by either a machine or a human user. Message 322 may inform a user of remote device 216 that battery 316 of wireless device 210 is low and to standby while battery 316 is replaced, or while the user of wireless device 210 switches to an alternative device. Furthermore, message 322 may indicate that since battery 316 is low, the user of wireless device 210 may be unable to re-establish communications, and in the event communications are terminated, remote device 216 should not try to re-establish communications. In a variation upon this embodiment when base station 212 receives the low battery capacity status signal from wireless device 210, control system 320 of bas station 212 may simply record that fact, and then later when the battery fails, control system 320 of base station 212 will send message 322.

In additional embodiments, upon the transmission of message 322 by control system 320 of base station 212, base station 212 may maintain the connection with remote device 216 through network 214 during a period in which the erstwhile user of the wireless device may seek to employ another device, such as a telephone 220, to resume communications with remote device 216 through network 214. During such time, base station 212 may periodically repeat message 322, or may, in the alternative, transmit other messages or on-hold music.

Figure 4:
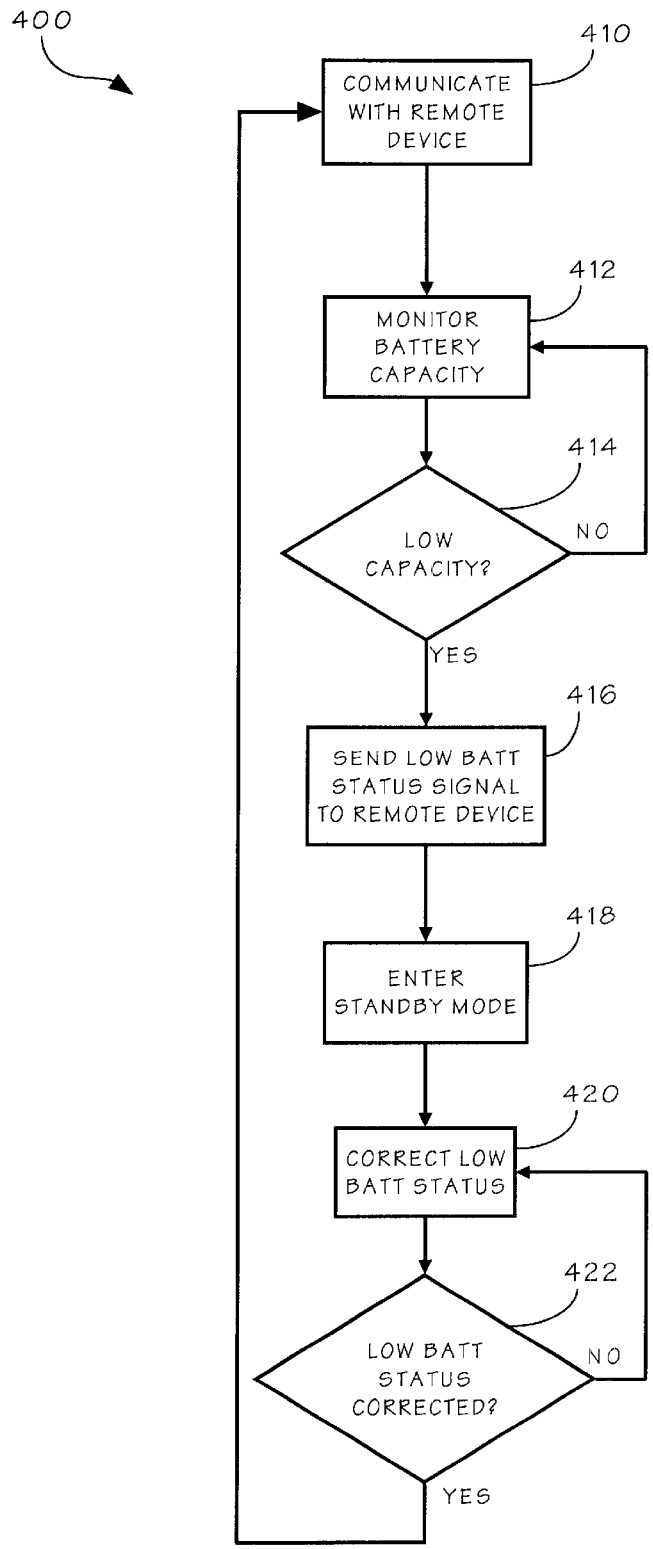
FIG. 4 is a flow diagram of a method for indicating low battery capacity status in accordance with the present invention.

Referring now to FIG. 4, a flow diagram of a method for indicating low battery capacity status in accordance with the present invention will be discussed. The method 400 initiates with wireless device 210 communicating with remote device 216 at step 410. Detector 314 monitors the capacity of battery 316 at step 412 and sends a signal indicative of the battery capacity status of battery 316 to control system 312. A determination is made at step 414 whether battery 316 is in a low capacity condition. While battery 316 is not in a low capacity condition, detector 314 continues to monitor the capacity of battery 316 at step 412. In the event detector 314 detects a low capacity status in battery 316, detector 314 sends a low battery capacity status signal to control system 312 at step 416 that may be either an analog or a digital signal. For example, control system 312 transmits the low battery capacity status signal to remote device 216 from transceiver 310 to transceiver 318 of remote device 216 via wireless transmission system 218. The low battery capacity status signal may be ultimately transmitted to remote device to 216 via network 214. After transmission of the low battery capacity status signal to remote device 216, a standby mode is entered into at step 418 such that communications between wireless device 210 and remote device 216 are not terminated.

Standby mode may be characterized as a state wherein remote device 216 is maintaining communications over network 214 to a least base station 212. Thus, although wireless device 210 is no longer communicating with base station 212 via wireless transmission system 218, the connection between base station 212 and remote device 216 may be maintained in the standby mode. As an alternative embodiment wherein base station 212 may be considered as the remote device, standby mode may be entered into by wireless device 210 by switching into a lower power operational mode such that a communications link may be maintained between wireless device 210 and base station 212 while battery consumption is minimized. In this case, wireless device 210 may still be receiving operational power from battery 316 and may still be communicating at a minimal level with base station 212 until the low battery capacity condition is corrected. As a further alternative, while in a standby mode, wireless device 210 may receive operational power from a standby power source, for example a backup battery, capacitor, external power source, etc., or, in the alternative, the user may choose to switch to an alternative device such as telephone 220.

While in the standby mode, the low battery capacity status condition is corrected at step 420. The correction of low battery capacity status of battery 316 may be accomplished in one or more ways. For example, if a backup battery (not shown) is available, wireless device 210 may switch to receive operational power from the backup battery. Alternatively, a user of wireless device 210 may replace battery 316 having a low capacity with a replacement battery having a higher capacity and that is able to provide operational power to wireless device 210. As a further alternative, a user of wireless device 210 may switch during the hold state either to a second wireless device (not shown) having a higher capacity battery disposed therein, or to a non-wireless device such as telephone 220, such that communications with remote device 216 are not terminated during switching. A determination is made at step 422 whether the low battery status condition of battery 316 has been corrected. Upon correction of the low battery status of battery 316, communications between wireless device 210 and remote device 216 continue at step 410.

Although the invention has been described with a certain degree of particularity, it should be recognized that elements thereof may be altered by persons skilled in the art without departing from the spirit and scope of the invention. One or more embodiments of the invention, such as method 400, may be implemented as sets of instructions resident in the main memory 104 of one or more computer systems configured generally as described in FIG. 1. Until required by the computer system, the set of instructions may be stored in another computer readable memory such as auxiliary memory 106 of FIG. 1, for example in a hard disk drive or in a removable memory such as an optical disk for utilization in a CD-ROM drive, a floppy disk for utilization in a floppy disk drive, a floptical disk for utilization in a floptical drive, or a personal computer memory card for utilization in a personal computer card slot. Further, the set of instructions can be stored in the memory of another computer and transmitted over a local area network or a wide area network, such as the Internet, when desired by the user. Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the method and system for notification of low-battery status in a wireless network of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A method for notifying a remote device of a low battery capacity condition in a wireless device communicating with the remote device, comprising:

monitoring the capacity of the battery wherein a low capacity condition may be detected while the wireless device and the remote unit are in communication;

upon detecting a low capacity condition of the battery, sending a low battery capacity status signal to the remote device; and while the battery is in a low battery capacity condition, maintaining communications between the wireless device and the remote device until the low battery capacity condition is corrected, otherwise sending a normal battery level status signal to the remote device.

2. A method as claimed in claim 1, further comprising the step of placing the wireless device into a standby mode while the battery is in a low battery capacity condition.

3. A method as claimed in claim 1, further comprising the step of correcting the low battery capacity status during the standby state until a normal battery capacity status is attained.

4. A method as claimed in claim 1, further comprising the step of correcting the low battery capacity status during the standby state until a normal battery capacity status is attained, and, upon correcting the low battery capacity status of the battery, recommunicating with the remote device.

5. A computer readable medium for causing an information handling system to execute steps for notifying a remote device of a low battery capacity condition in a wireless device communicating with the remote device, the steps comprising:

monitoring the capacity of the battery wherein a low capacity condition may be detected while the wireless device and the remote unit are in communication;

upon detecting a low capacity condition of the battery, sending a low battery capacity status signal to the remote device; and while the battery is in a low battery capacity condition, maintaining communications between the wireless device and the remote device until the low battery capacity condition is corrected, otherwise sending a normal battery level status signal to the remote device.

6. A computer readable medium as claimed in claim 5, the steps further comprising the step of placing the wireless device into a standby mode while the battery is in a low battery capacity condition.

7. A computer readable medium as claimed in claim 5, the steps further comprising the step of correcting the low battery capacity status during the standby state until a normal battery capacity status is attained.

8. A computer readable medium as claimed in claim 5, the steps further comprising the step of correcting the low battery capacity status during the standby state until a normal battery capacity status is attained, and, upon correcting the low battery capacity status of the battery, recommunicating with the remote device.

* * * * *